United States Patent
Li et al.

(10) Patent No.: US 7,321,140 B2
(45) Date of Patent: Jan. 22, 2008

(54) MAGNETRON SPUTTERED METALLIZATION OF A NICKEL SILICON ALLOY, ESPECIALLY USEFUL AS SOLDER BUMP BARRIER

(75) Inventors: Yanping Li, Mountain View, CA (US); Jriyan Jerry Chen, Santa Clara, CA (US); Lisa Yang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 350 days.

(21) Appl. No.: 11/077,943

(22) Filed: Mar. 11, 2005

(65) Prior Publication Data

US 2006/0202352 A1   Sep. 14, 2006

(51) Int. Cl.
    *H01L 29/73* (2006.01)
(52) U.S. Cl. .............. 257/203; 257/E29.143; 257/E29.139; 257/203; 438/612; 438/613; 438/614; 438/615
(58) Field of Classification Search ........... 257/203, 257/E29.143, E29.139; 438/612, 613, 614, 438/615
See application file for complete search history.

(56) References Cited

U.S. PATENT DOCUMENTS

| | | | |
|---|---|---|---|
| 3,855,612 A | * | 12/1974 | Rosvold ............ 257/479 |
| 5,719,070 A | | 2/1998 | Cook et al. |
| 6,107,180 A | | 8/2000 | Munroe et al. |
| 6,365,014 B2 | | 4/2002 | Finley |
| 6,423,196 B1 | | 7/2002 | Ivanov |
| 6,597,069 B1 | | 7/2003 | Degani et al. |
| 6,664,640 B2 | * | 12/2003 | Kohno ............ 257/774 |

OTHER PUBLICATIONS

Sundar Ramamurthy et al., "Nickel silicide formation using low-temperature spike anneal", *Solid State Technology*, Oct. 2004, 37-38, 40 pp.

* cited by examiner

*Primary Examiner*—Matthew Smith
*Assistant Examiner*—Thanh Van Pham
(74) *Attorney, Agent, or Firm*—Law Offices of Charles Guenzer

(57) ABSTRACT

A nickel silicon alloy barrier layer formed between a metal bonding pad on an integrated circuit and a tin-based solder ball, for example, a lead-free solder. The nickel silicon alloy contains at least 2 wt % silicon and preferably less than 20 wt %. An adhesion layer may be formed between the barrier layer and the bonding pad. For copper metallization, the adhesion layer may contain titanium or tantalum; for aluminum metallization, it may be aluminum. The nickel silicon alloy may be deposited by magnetron sputtering. Commercially available $NiSi_{4.5}\%$ sputter targets have provided a superior under-bump metallization (UBM) with lead-free tin solder bumps. Dopants other than silicon/may be used to reduce the magnetic permeability and provide other advantages of the invention.

24 Claims, 4 Drawing Sheets

_US 7,321,140 B2_

MAGNETRON SPUTTERED METALLIZATION OF A NICKEL SILICON ALLOY, ESPECIALLY USEFUL AS SOLDER BUMP BARRIER

FIELD OF THE INVENTION

The invention relates generally to the fabrication of silicon integrated circuits. In particular, the invention relates to the formation of bump metallizations between integrated circuits and a support substrate.

DESCRIPTION OF THE BACKGROUND ART

One of the last steps in the fabrication of silicon integrated circuits (ICs) establishes the electrical connections between the circuitry formed in the silicon IC chip and the other electrical components in the electronic system of which the IC chip is a part. Older technology utilized wire bonding between pads on the IC chip and an IC package having multiple connection pins, which were fixed to a printed circuit board (PCB) and electrically connected to a wiring pattern on the PCB. Typically, the IC package pins were directly soldered to the wiring pattern on the PCB or were reversibly inserted into IC sockets soldered to the board.

Wire bonding is a lengthy serial process even when automated. Inserting IC packages onto the PCB is a process that is not easily automated. Accordingly, a preferred process at the present time includes flip chip bonding involving under bump metallization (UBM) in which the active side of the IC chip is directly bonded to the electrical circuit on the PCB or other supporting substrate through solder bumps deposited either on the chip or the supporting substrate.

An example of a conventional flip chip bonding technique will be described with reference to the cross-sectional view of FIG. 1. An integrated circuit chip 10 is form in a silicon wafer 12 is processed according to well known techniques to develop a replicated pattern of integrated circuits in a device layer 14 of the wafer 12. Although a monocrystalline silicon wafer is most common, the invention is equally applicable to silicon layers formed on other substrates, such as SOI (silicon on insulator) wafers. Typically, the bottommost active sub-layer in the device layer 14 includes the semiconductor circuitry whether it be logic or memory. For advanced integrated circuits, there may be billions of semiconductor devices formed in the active sub-layer. The upper sub-layers typically include multiple layers of metallizations, five metallization layers are not unusual, to interconnect the large number of active areas and to connect to the outside electrical lines, whether for input, output, or power. The uppermost metallization layer includes a substantial number of contact pads 16, which are typically formed at the same time as horizontal and perhaps vertical interconnection lines in the uppermost metallization level. The uppermost metallization level may include not only the contact pads 16 but also some horizontal interconnects composed of the same metal as the pads 16. For aluminum metallization, the pads 16 are formed in the final metallization level by aluminum sputter deposition. For copper metallization, the pads 16 are typically formed in the final metallization level by copper electroplating. The contact pads 16 have a relatively large lateral extent, for example, to 20 or 50 to 100 µm but a depth of only about 0.2 to 2 µm, a depth typical for metallization layers. It is understood that the typical processing is performed at the wafer level. There may be tens to hundreds of contact pads 16 for each chip and on the order of hundreds of chips for each wafer. Therefore, the described steps can be efficiently performed in parallel at the wafer level prior to dicing the wafer into separate integrated circuits.

A dielectric layer 18, typically composed of a polymeric spin-on glass or plasma deposited nitride or oxynitride, electrically isolates the multiple contact pads 16. A planar UBM (under bump metallization) layer 20 is then deposited and photolithographically defined. Solder balls 22 are deposited over the UMB layer 20, typically by electroplating or printing through a mask although but pulsed lasers have been used to locally melt a solder wire. A solder reflow is performed to cause the solder bump 22 to react with and contact to the UMB layer 20. The reflow anneal step further causes the solder to form into a ball-shaped solder bump 26 as illustrated.

The fabrication technique described above is illustrative only. There are many known techniques for depositing and defining the areas of the metallization and the solder bump, for example, as described by Degani in U.S. Pat. No. 5,904,859 and by Munroe et al. in U.S. Pat. No. 6,107,180, both incorporated herein by reference in their entireties.

At this point, the wafer is usually diced into the multiple integrated circuit dice, each die or chip including tens to hundreds of the illustrated contact pads 16. The contact pads 16 may be arranged around the periphery of the active area of the chip or may be arranged in a multi-row pattern over most of the top layer of the chip. As illustrated in the cross-sectional view of FIG. 2, the chip 10 is inverted and its bumps 26 are aligned with and pressed against corresponding contact pads 28 in a PCB or other support substrate 30 at an elevated temperature in what amounts to another reflow in which the solder reacts with both the substrate 30 and the contact pads 28. The pads 28 are typically composed of copper or nickel overlying the copper metallization of the PCB. The substrate contact pads 28 provide not only mechanical support but also electrical contact to the electrical PCB interconnection pattern because of the reasonable electrical conductivity of the UBM layer 20 and the solder bump 22.

There are many forms for the PCB board 30 and its metallization 28. Often the PCB board contains multiple levels of wiring, each having its own metallization 28. Often vias are formed partially or completely through the PCB board and the metallization 28 may coat the side or bottom of vias. The solder 22 can reflow into vias to complete the electrical contacts in or through the vias.

The UBM layer 20 may include multiple sub-layers since it performs several different functions. It needs to provide adequate wetting and adhesion between the UBM layer 20 and both the solder 22 and the final metal layer of the contact pad 16. Importantly, it needs to act as a barrier layer. The solder 22 typically consists of heavy metals including tin and lead. Such heavy metal should be prevented from diffusing into the metallization 16 and possibly down to the active silicon layer.

In the past, the solder layer 22 was formed of a eutectic lead-tin (PbSn) alloy having a composition of approximately 63 wt % tin and 37 wt % lead. The eutectic PbSn has the advantage of a low melting temperature of about 183° C., which allows the solder reflow to be typically performed at 210 to 220° C. However, lead is now widely disfavored because of its environmental and general medical effects incurred during the IC fabrication and in the disposal of the increasing amount of toxic electronic waste. Europe and Japan have already implemented strict standards and are debating imposing bans against lead-containing solder. The U.S. is expected to impose restrictions by 2006. As a result, much effort has been expended in developing a lead-free or at least reduced-lead solder typically having a higher tin content. Heretofore, however, the lead-free solders have introduced substantial difficulties with the barrier layer. The difficulties have been complicated by the switch from aluminum to copper metallization in the semiconductor chips.

Nickel is generally perceived as being the preferred barrier material as Cook et al. described for a nickel-containing UBM in U.S. Pat. No. 5,719,070. Nickel however presents difficulties when it is deposited by magnetron sputtering since its magnetic permeability limits the nickel target to be relatively thin because the target shunts the magnetic field from the magnetron and hence is not preferred for commercial use. Wet electroless plating has been used to deposit 10 to 20 μm films of Ni(P) (nickel doped with phosphorous) as the barrier layer in addition to a gold wetting and passivation layer. Such a barrier layer tends to be insufficiently dense and be subject to formation of voids due to $Ni_3P$ recrystalllization. NiV barrier layers have been quite useful with PbSn solders in a Al/NiV/Cu trilayer with the Cu protecting the NiV from the solder. This combination is especially useful because NiV with 7 wt % of V is non-magnetic, thus promoting its deposition by magnetron sputtering. However, for Sn-rich Pb-free solders, NiV/Cu introduces difficulties. Copper and tin readily form an intermetallic compound so that the Cu is quickly dissolved and exposes the NiV layer subject to tin diffusion.

Generally, the barrier layer and associated sub-layers should react relatively slowly with the solder. Otherwise, the solder breaches the barrier layer and its tin or other fast-diffusing heavy metal component is directly exposed to the metallization.

A further consideration is that the UBM layer is preferred to exhibit compressive stress rather than tensile stress. Residual tensile stress tends to make it difficult to bond the chip and to cause peeling of the processed layers from the wafer substrate. Conventionally, tensile stress in NiV films has been reduced, as illustrated by plot 40 in the graph of FIG. 3, by increasing the amount of RF bias power applied to the pedestal electrode supporting the wafer in a magnetron sputter reactor. Although wafer biasing is effective, it narrows the process window and the biasing introduces the possibility of damaging the film by bombardment of energetic ions on the biased wafer.

SUMMARY OF THE INVENTION

An under bump metallization (UBM) or other metallization includes a nickel-based metallization layer comprising nickel and silicon. For example, a barrier layer in under bump metallization beneath a tin-based solder is composed of a nickel silicon alloy, for example, with 4.5 wt % silicon formed over a contact metallization in a substrate. A tin-based solder is deposited on the nickel-based metallization layer for later contacting to a metal pad on a second substrate. A solder free of lead is preferred but other solders may be used such as the conventional eutectic PbSn solder.

The silicon fraction in the nickel silicon alloy is preferably more than 2 wt %. The upper silicon fraction is preferably less than 50 wt %, more preferably less than 20 wt %, and most preferably less than 10 or even 5 wt %. A silicon fraction of 4.5 wt % has been demonstrated to provide superior overall performance.

An adhesion layer may be deposited between the nickel-based metallization and the contact metallization. For copper contact metallization, the adhesion layer may be formed of titanium or tantalum or compounds thereof. For aluminum contact metalllization, the adhesion layer may be formed of aluminum. However, other adhesion materials may be used A sacrificial layer, for example, of copper or gold, may be deposited on the top of the NiSi alloy for improved wetting and passivation.

The nickel silicon alloy is advantageously deposited by magnetron sputtering. The compressive stress can be minimized by reducing the RF power to pedestal supporting the substrate, for example, less than 100W normalized to a 300 mm-diameter wafer, the extreme of which is leaving wafer electrically floating.

DETAILED DESCRIPTION OF THE PREFERRED EMBODIMENTS

A metallization for contacting solder bumps may advantageously include a nickel silicon alloy layer. Such a metallization is particularly useful for contacting a metallization pad to a lead-free solder, such as one having a high tin content. Experiments have shown exemplary contacts grown with slower reactions and hence improved characteristics, desirable degrees of compressive stress, and lower resistivity. A nickel silicon alloy metallization is especially advantageous since it my be easily and economically deposited by magnetron sputtering.

Figure 1:
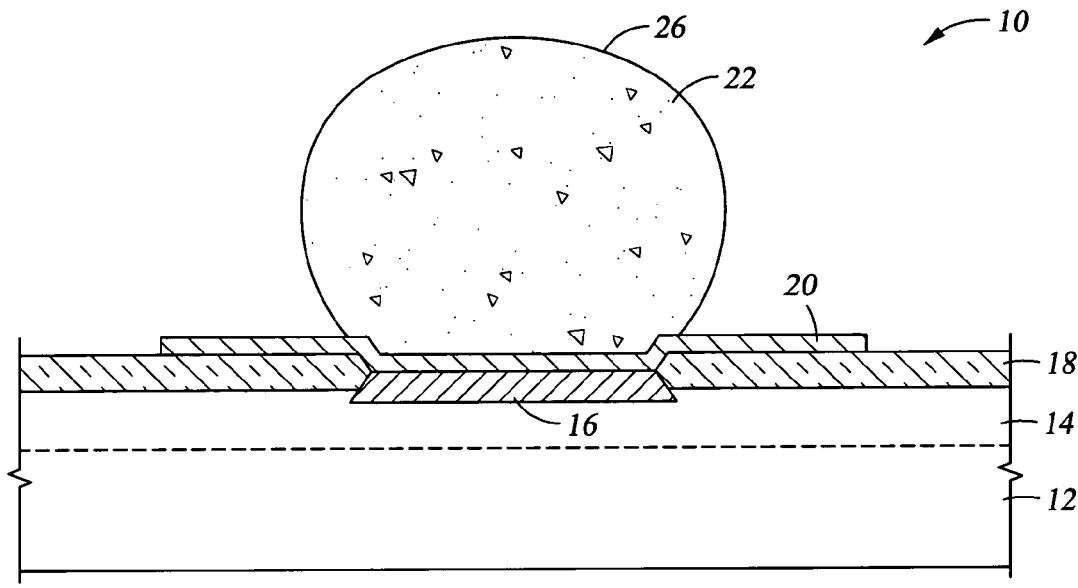
FIG. 1 is a cross-sectional view of a conventional configuration of a solder bump on an integrated circuit.
Figure 4:
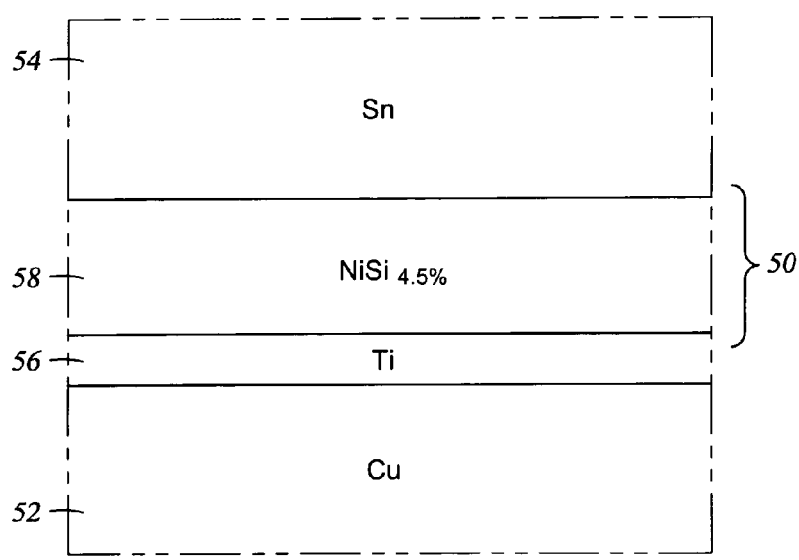
FIG. 4 is a cross-sectional view of one embodiment of an under bump metallization (UBM) of the invention utilizing a nickel silicon alloy barrier layer and applied to a copper contact pad.

An exemplary structure including a nickel silicon alloy barrier of one embodiment of the invention is illustrated in the cross-sectional view of FIG. 4. A under bump metallization (UBM) layer 50 is formed between a copper metallization layer 52, which may be the pad 16 of FIG. 1, and a tin solder layer 54 is formed over the UBM layer 50. It is understood that the copper of the pad 16 may be overlaid with a thin surface layer of other material such as nickel. The solder layer 54 preferably principally comprises tin and which may be the solder bump 26 of FIG. 1. The copper metallization layer 52 consists of copper and up to 10 wt % (typically no more than two wt %) of alloying and other elements, such as silicon or aluminum. For a lead-free solder, the solder layer 54 includes substantially no lead, but may additionally contain other dopants, such as silver, copper, indium, or bismuth, for example, up to 20 wt %.

Figure 2:
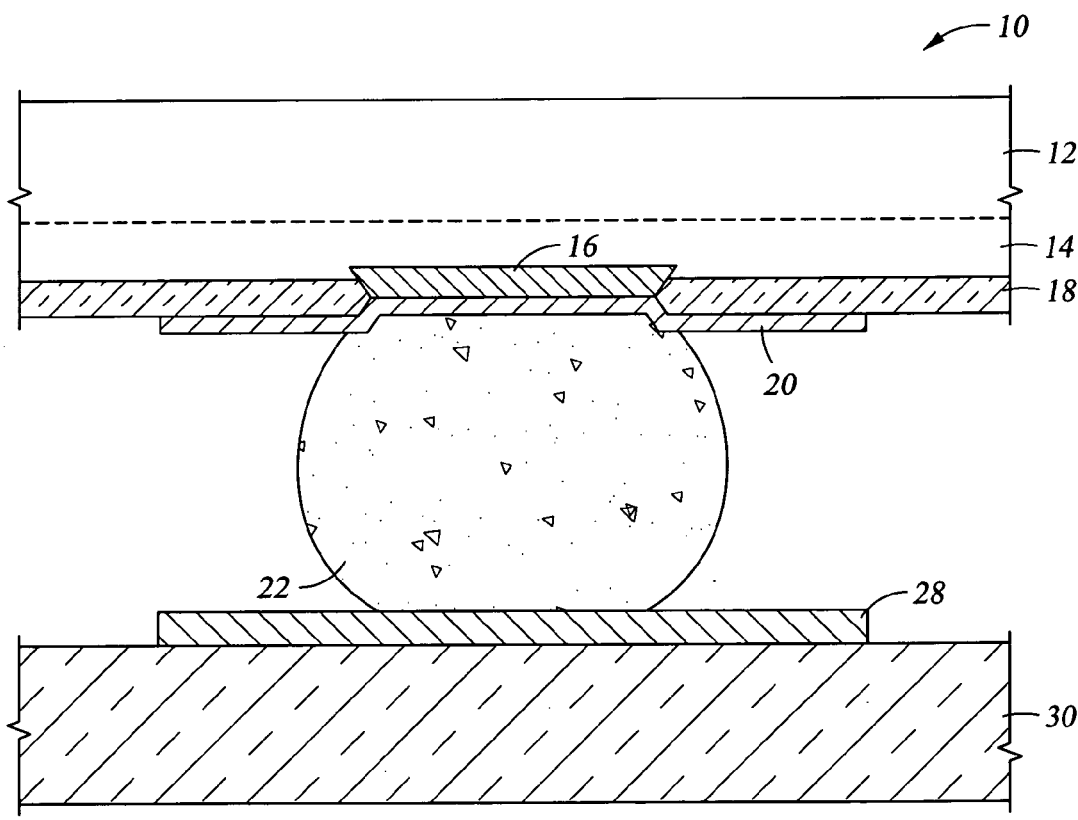
FIG. 2 is a cross-sectional view of the conventional solder bump of FIG. 1 bonded to a support substrate.

The UBM layer 50 may include a titanium adhesion layer 56 and a nickel silicon alloy barrier layer 58, both of which may be deposited by magnetron sputtering. The titanium adhesion layer improves the adhesion of the UBM layer 50 to the underlying copper layer 52. The nickel silicon alloy barrier layer 58 is believed to be mostly useful for providing a diffusion barrier between the constituents of the solder layer 54 and the copper metallization layer 52. A typical thickness for the nickel silicon alloy layer 58 is greater than 400 nm and less than 2 μm but the thickness can be tuned for specific applications and structures. The thickness of the titanium adhesion layer 56 is advantageously chosen between 40 and 400 nm. An additional wetting layer, such as gold or copper, may be deposited between the nickel silicon alloy layer 58 and the solder layer 54 before the solder is applied. However, it is observed that nickel silicon alloy adequately wets with tin. The nickel silicon alloy layer 58 may be etched, for example by wet etchants conventionally used for NiV, such as $H_3PO_4:HNO_3:H_2O$ to define the localized UBM layer 20 of FIGS. 1 and 2.

The composition of the nickel silicon alloy layer 58 may be advantageously chosen such that a sputtering target of the same or nearly the same composition is non-magnetic or at least less magnetic than nickel. The reduction of magnetic permeability in the target facilitates magnetron sputtering in which the magnetic field from a magnetron in back of the target needs to penetrate to the front (sputtering) face of the target. Nickel silicon alloy targets having a composition of $NiSi_{4.5}\%$ are well known for use in sputtering nickel on silicon in areas of front-end contacts. Ivanov has described such a target in U.S. Pat. No. 6,423,196. As far as is known, such a nickel silicon alloy target has been used in the past only to deposit a nickel-based layer onto semiconducting silicon, which is then further silicided with the silicon to form an ohmic contact, as discussed by Ramamurthy et al. in "Nickel silicide formation using low-temperature spike anneal," *Solid State Technology*, October 2004, pp. 37, 38, and 40.

The preferred target contains sufficient silicon that it is substantially non-magnetic and thus readily used in a magnetron sputter reactor to be described later. A composition of $NiSi_{4.5}\%$ has been found to be easily incorporated into a magnetron sputter reactor. The notation $NiSi_{4.5}\%$ does not conform to standard chemical notation although it follows common notation in defining the compositions of alloys. The stated percentage of silicon is the weight percentage of silicon in the alloy so that the nickel weight percentage should be reduced by a same amount. Further experiments have shown target silicon compositions as low as $NiSi_{2.0}\%$ can advantageously be used in magnetron sputter reactors. Even lower silicon content would enjoy some advantages of the invention but with increased magnetic shunting. The upper silicon limit has not been determined. A maximum silicon content promoted by Ivanov is $NiSi_{50}\%$ although $NiSi_{20}\%$ is thought to provide a better barrier. A more conservative upper limit for the silicon content would be $NiSi_{10\%}$, which provides good barrier qualities and low magnetization. It is understood that other alloying elements may be added to the nickel silicon alloy preferably with a total weight percentage less than that of silicon. Typically, the nickel content of the alloy is above 70 wt %, preferably above 80 wt %. With silicon content below 5 wt %, the nickel content of the alloy is preferably above 90 wt %.

Figure 5:
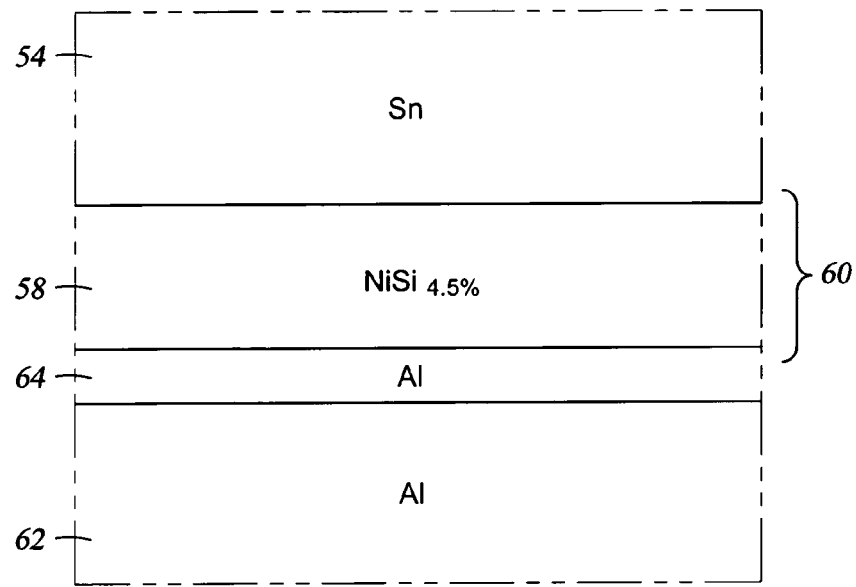
FIG. 5 is a cross-sectional view of a second embodiment of an UBM of the invention utilizing the nickel barrier layer and applied to an aluminum contact pad.
Figure 6:
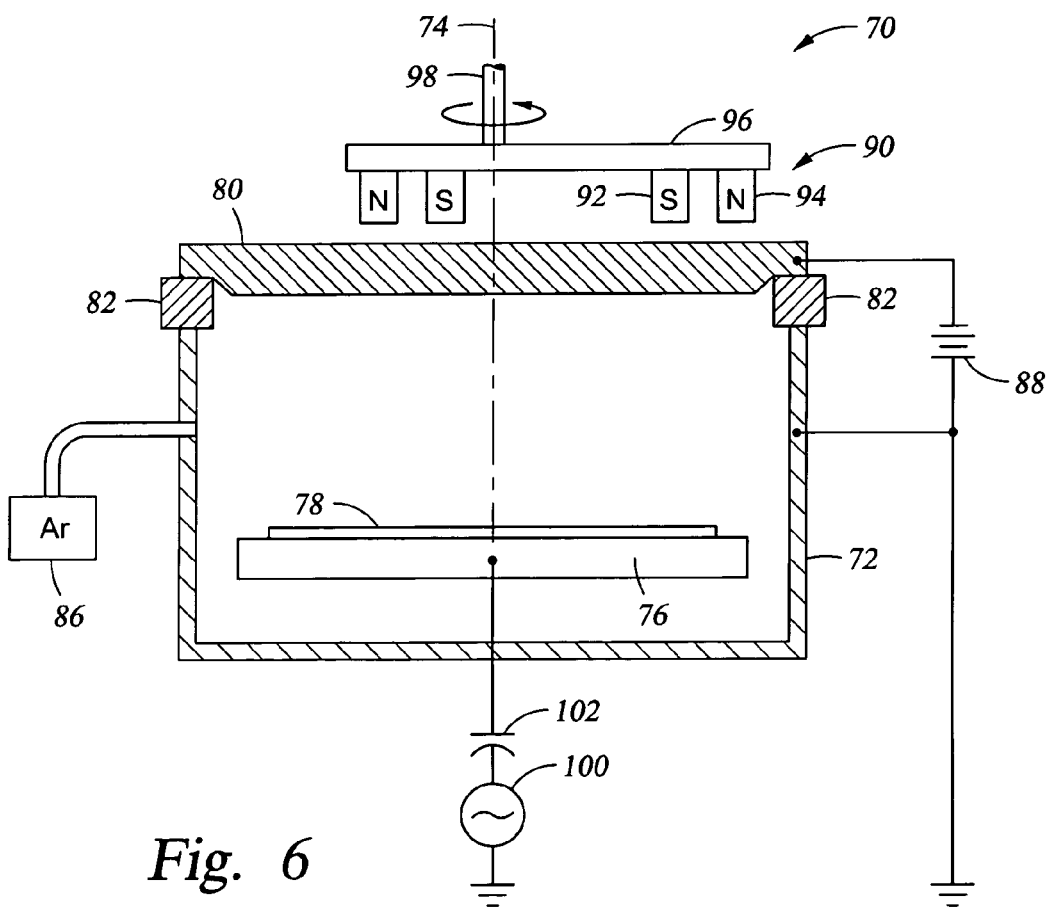
FIG. 6 is a schematic cross-sectional view of a magnetron sputter reactor useful for depositing a nickel silicon alloy layer.

An aluminum metallization structure is illustrated in the cross-sectional view of FIG. 5. A UBM layer 60 is interposed between an aluminum metallization layer 62 and a lead-free, tin-rich solder layer 54. The UBM layer 60 includes an underlying adhesion layer 64 of aluminum, which relieves stress and promotes the adhesion of the nickel silicon alloy layer 58 to the pre-existing thicker aluminum layer 62. Aluminum is understood to contain up to 10 wt % of other alloying elements, for example, silicon or copper, typically added to reduce electromigration Extensive experiments were performed for forming nickel silicon barriers on copper metallizations. The nickel silicon alloy was deposited in a magnetron sputter reactor 70 schematically illustrated in the cross-sectional view of FIG. 6. A vacuum chamber 72 is formed around a central axis 74 and contains a pedestal electrode 76 supporting a wafer 78 to be sputter coated. A target 80 is supported on and vacuum sealed to the chamber 72 in opposition to the wafer 78 but an annular isolator 82 electrically isolates the target 80 from the chamber 72, which is electrically grounded. Unillustrated sputtering shields protecting the chamber walls are typically also at least partially grounded. The target 80 has at least its bottom face composed of the material to be sputter deposited on the wafer 78. In this case, the target material is nickel silicon alloy, for example $NiSi_{4.5}\%$.

A gas source 86 supplies argon as a sputtering working gas into the vacuum chamber 72. An unillustrated vacuum pumping system maintains the pressure within the vacuum chamber in the low milliTorr range. A DC power supply 88 negatively biases the target 80 to a few hundred volts with respect to the grounded chamber 72 to discharge the argon into a plasma. The positively charged argon ions are strongly attracted to the negative target and sputters the target material from it. Some of the target material strikes the wafer 78 and deposits a film of the target material on it.

A magnetron 90 is positioned in back of the target 80 to project a magnetic field parallel to the front face of the target 80 to thereby increase the plasma density and the sputtering rate. The magnetron 90 may be a conventional magnetron used for aluminum sputtering and include a closed band of opposed magnetic poles 92, 94 supported on a plate 96 and asymmetrically arranged about the central axis 74. The plate 96 is supported on a rotary shaft 98 extending along the central axis to rotate the magnetron 90 and hence produce a more uniform sputtering profile on the target 80.

A problem of sputtering nickel-based materials is that pure nickel is a magnetic material, which shunts the magnetic field of the magnetron 90 away from the front face of the target 80 and hence reduces the efficiency of magnetron sputtering. The shunting can be minimized by reducing the thickness of the target 80 or at least its nickel-containing sputtering face. However, reduced thickness means that the target 80 will need to be replaced more frequently when the nickel-containing layer is sputtered through. Advantageously, nickel silicon alloy with a silicon content of 4.5 wt % or greater is substantially non-magnetic. As a result, the target 80 does not substantially shunt the magnetic field, the magnetron is more effective at increasing the sputtering rate, and the target thickness can be increased. As mentioned previously, a nickel silicon alloy target having a silicon content of 2 wt %, although it is somewhat magnetic, has been observed to be satisfactory for magnetron sputtering.

Figure 3:
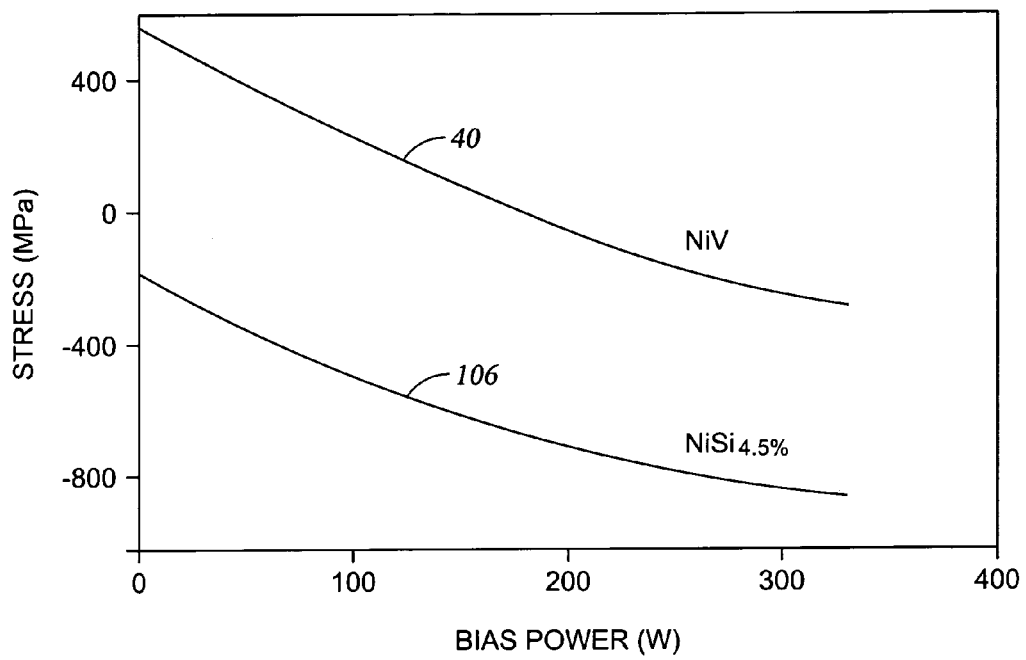
FIG. 3 is a graph illustrating the dependence wafer biasing of barrier layers deposited by sputtering.

Optionally, an RF power supply 100 may be connected to the pedestal electrode 76 through a capacitive coupling circuit 92. In the presence of a plasma, the RF power causes a negative DC self-bias to develop on the pedestal electrode 76 and its supported wafer 78. Even if no RF power is applied, the electrically floating pedestal electrode 76 develops a significant negative DC self-bias. It has been found that the amount of wafer bias strongly affects the stress developed in the sputter deposited nickel silicon alloy film. As illustrated by plot 106 in the graph of FIG. 3, the amount of stress in a $NiSi_{4.5}\%$ sputter deposited film strongly depends on the wafer biasing. However, even for a floating wafer (zero wafer bias power), the stress is compressive, as desired. In contrast, the conventional sputter deposited NiV film is tensile at zero bias power and high wafer biasing is required to form an unstressed or compressively stressed film. Generally, no wafer biasing with the wafer left electrically floating or low wafer biasing is desired to prevent charging and other deleterious effects of energetic ions upon the deposited film and other portions of the integrated circuit. For example, less than 100W of RF power is applied to the pedestal electrode supporting a 300 mm-diameter wafer and this power level is normalized to the area of other sizes of substrates.

Several comparisons were made with conventional barrier materials. The inventive $NiSi_{4.5}\%$ barrier has resistivity of 40 μΩ-cm in comparison to 10 μΩ-cm for pure nickel and 53 μΩ-cm for $NiV_{7.5}\%$.

Cross-sectional TEM (transmission electron microscopy) images were obtained for NiV and NiSi sputter deposited films. The NiV material exhibit a strong columnar crystallography with columns having a width of somewhat less than 100 nm. In contrast, the NiSi material show some similar columnar crystallography but the columns have lengths only slightly greater than their widths. The overall NiSi crystallography is much more irregular across the thickness of the film. Grain boundaries are believed to provide the principal diffusion path through these polycrstalline barrier materials. The long, regular columns of NiV are believed to promote the diffusion of nickel and thus increase the reaction rates at the interface. In comparison, the more irregular crystalline structure of NiSi are believed to impede the diffusion of nickel and silicon and hence slow the reaction rates.

TEM images were also obtained for both NiV and NiSi UBM structures including 100 nm of Ti, 400 nm of NiSi or NiV, and lead-free SnAgCu solder, that is, tin-based solder alloyed with silver and copper. The TEMs were obtained after the first solder reflow at 250° C. for 1 minute. The TEM for NiV showed a complete reaction of the NiV barrier layer with the tin solder to produce a nearly uniform amorphous that directly contacts the titanium adhesion layer.

Figure 7:
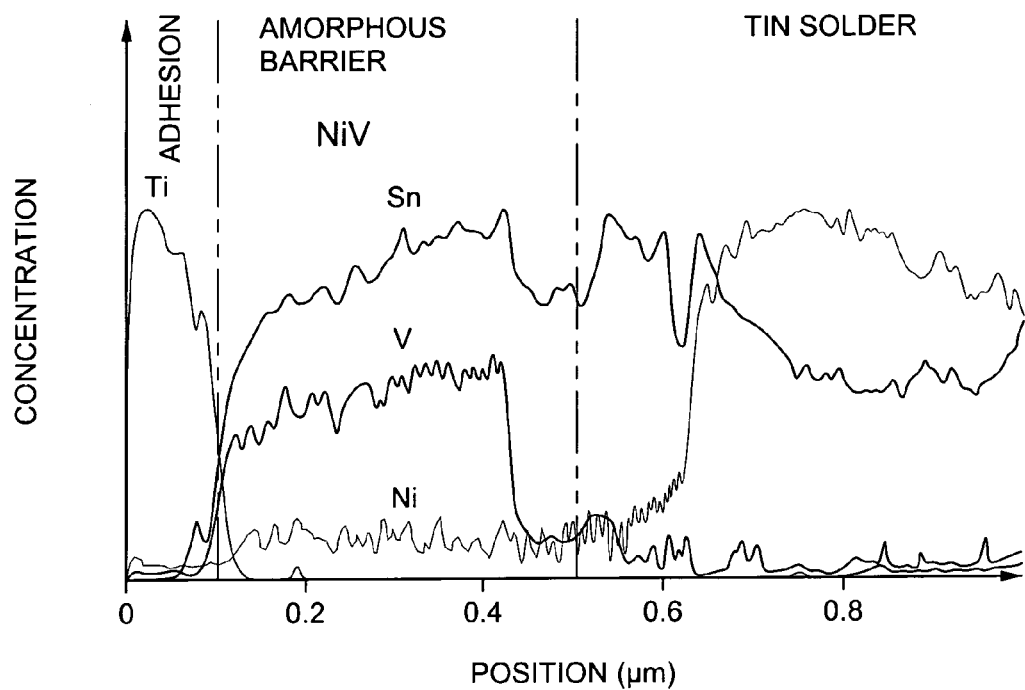
FIG. 7 is a graph illustrating elemental concentration profiles for a conventional UBM metalllization including a NiV barrier after one minute of reflow reaction with lead-free SnAgCu solder at 250° C.

The TEM results were consistent with Auger electron spectroscopy (AES) elemental concentration profiles illustrated in the graph of FIG. 7 for NiV. The Auger profiles of FIG. 7 shows the amorphized barrier layer to be rich in tin. The rapidity of the reaction in NiV is consistent with the tin solder transforming into large grains (>1 μm) grains of the intermetallic compound $Ni_3Sn_4$. As a result, there is a large diffusion of nickel from the barrier into the solder leaving a vanadium-rich and nickel-poor barrier layer that is believed to be ineffective at blocking further diffusion of tin into the underlying titanium and copper. Further, because tin does not adhere well to aluminum or titanium underlayers, the reacted barrier layer is likely to separated from the adhesion layer and cause the solder balls to peel from the contact pad.

Figure 8:
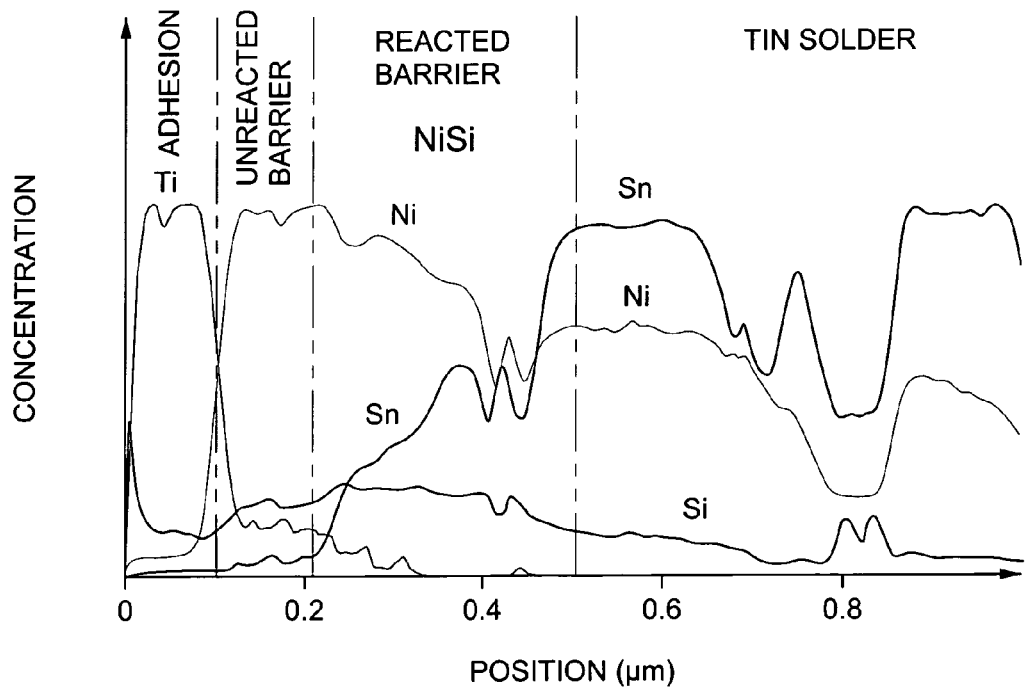
FIG. 8 is a graph illustrating elemental concentration profiles for an inventive UBM metallization including a NiSi barrier under the same conditions of reflow reaction.

On the other hand, the TEM for NiSi shows that about 100 nm of the NiSi barrier layer remains unreacted. Further, the tin solder does not exhibit the large intermetallic grains. The AES profiles illustrated in the graph of FIG. 8 for $NiSi_{4.5}\%$ confirm the NiSi composition of the unreacted layer. Further, it shows that the reacted portion of the NiSi barrier layer continues to have a high nickel content and a low tin content, especially near the boundary with the unreacted portion and near the titanium adhesion layer. The silicon and nickel in the NiSi barrier are seen to diffuse together into the tin solder while the vanadium in the NiV barrier separates from the nickel during the out diffusion into the tin solder and what remains behind does not react with or form an alloy with the in diffusing tin, thereby producing a weak amorphous barrier. The TEM and Auger results demonstrate the distinctly different behaviors of NiV and NiSi and explain the advantages of the NiSi barrier material.

Preliminary tests for solder bump reliability were performed by pulling and shearing soldered joints. The NiV joints fail at the interface between the solder ball and the remaining tin- and vanadium-rich UBM layer while the NiSi joint failed within the solder ball.

The described embodiments have used silicon as the major dopant in the nickel-rich barrier. The silicon provides superior overall performance for the following reasons. First, doping silicon into nickel dramatically reduces the magnetic permeability of nickel without significant affecting its wetting and barrier characteristics. Second, in contrast to the segregation of vanadium from nickel in the out diffusion, silicon moves together with the nickel so that the NiSi/Sn interface is much less abrupt and free of voids after extended high-temperature storage and multiple reflows. Thirdly, the addition of silicon introduces a compressive stress and does not significantly increase the resistivity. Fourthly, the polycrystalline film structure is less column has fewer defects extending through the film thickness, such as columnar grain boundaries, which facilitate the deleterious tin diffusion.

None of these advantages necessarily require silicon doping. Other dopants providing some or all of these advantages may be used in addition to or in place of silicon. It is believed that a useful dopant is added in sufficient concentration, typically greater than 2 wt %, to leave at least 90 wt % and preferably at least 95 wt % of nickel while reducing the magnetic permeability of the alloy over that of nickel. Non-exclusive examples of dopants include magnesium, aluminum, gallium, and germanium as well as silicon All these lack unfilled d-shells of electrons and hence are expected to reduce the magnetic permeability.

Although the invention facilitates the use of lead-free tin-based solders, the invention may be applied to other solders, for example, tin-based solders with some lead content such as the conventional eutectic PbSn solder or, for example, containing more than 5 or 10 wt % of lead.

Although titanium is the most prevalently used adhesion layers, other compositions may be used in combination with the invention. For example, the adhesion layer may be composed of TiSiN, TiW, Ta, TiN, TaN, etc. Thin passivating layers may also be deposited over the NiSi barrier and wetting layer to provide better wetting and less oxidation. Exemplary passivating compositions are Cu, Au, Pd, etc.

Although the invention has been described with respect to flip chip bonding to PCB boards, which are typically formed from resin, the invention is not so limited. The supporting substrate may be, for example, a ceramic or other multi-chip carrier, which may include multiple levels of wiring. Other applications use a silicon chip as the carrier. Sometimes, a multi-chip module is formed as a single encapsulated IC package. The invention may also be used to form a single-chip IC package in which the package substrate contains the required bonding pads to which the IC solder bumps are bonded. The invention may further be applied to a multi-level stack of semiconductor layers and supports which are vertically bonded and electrically connected together through solder bumps. The invention may also be applied to bonding a MEMS (micro electro mechanical system) chip to a support substrate via solder bumps. The MEMS chip includes electrically actuated mechanical devices formed in silicon layers. The solder bumps may be used to both mechanically support the MEMS chip and to supply electrical control signals to it.

Thus, the inventive nickel silicon alloy metallization material can be easily and economically sputter deposited. Further, the nickel silicon alloy demonstrates a metallurgy with tin-based solders that is considered superior to nickel vanadium barriers and even pure nickel barriers and provides increased reliability over previously used barrier materials.

The invention claimed is:

1. A solder contact structure formed in an integrated circuit, comprising:
   a bonding pad comprising a metal region formed at a surface of an integrated circuit; and
   a barrier layer comprising a nickel silicon alloy comprising nickel and silicon formed over and defined around said bonding pad and adapted to contact a solder bump.

2. The structure of claim 1, further comprising a tin-comprising solder formed and defined over said barrier layer in an area of said bonding pad.

3. The structure of claim 2, wherein said tin-comprising solder is substantially free of lead.

4. The structure of claim 2, wherein said tin-comprising solder additionally comprises a substantial amount of lead.

5. The structure of claim 2, further comprising a wetting layer comprising at least one of gold and copper interposed between said baffler layer and said solder.

6. The structure of claim 1, wherein said bonding pad is connected to a wiring pattern in said integrated circuit.

7. The structure of claim 1, wherein said nickel silicon alloy contains at least 2 wt % of silicon.

8. The structure of claim 7, wherein said nickel silicon alloy contains no more than 20 wt % of silicon.

9. The structure of claim 8, wherein said nickel silicon alloy contains less than 10 wt % of silicon.

10. The structure of claim 9, wherein nickel silicon alloy contains less than 5 wt % of silicon.

11. The structure of claim 1, wherein said nickel silicon alloy comprises at least 70 wt % nickel.

12. The structure of claim 1, wherein said metal region principally comprises copper.

13. The structure of claim 1, wherein said metal region principally comprises aluminum.

14. The structure of claim 1, further comprising an adhesion layer formed between said metal region and said barrier layer.

15. The structure of claim 14, wherein said metal region comprises copper and wherein said adhesion layer comprises at least one of titanium and tantalum.

16. The structure of claim 14, wherein said metal region comprises aluminum and wherein said adhesion layer comprises aluminum.

17. The structure of claim 1, further comprising:
   a solder layer defined over a plurality of said banding pads; and
   a support substrate having & plurality of second metal regions to which different portions of said solder layer are respectively bonded.

18. A solder bump structure, comprising:
   a silicon integrated circuit formed in a substrate and including a copper bonding pad at a top surface thereof;
   an adhesion layer comprising at least one of titanium and tantalum formed on said bonding pad; and
   a barrier layer comprising a nickel silicon alloy comprising between 2 and 10 wt % silicon and at least 90 wt % nickel formed over said adhesion layer.

19. The structure of claim 18, further comprising a bump of lead-free tin-based solder formed over said barrier layer.

20. A solder contact structure formed in an integrated circuit, comprising:
   a bonding pad comprising a metal region formed at a surface of an integrau.ed circuit; and
   a barrier layer comprising a nickel alloy comprising at least 90 wt % of nickel and at least 2 wt % of a dopant formed over and defined around said bonding pad and adapted to contact a solder bump, wherein the dopant lacks an unfilled d-shells of electrons.

21. The structure of claim 20, wherein the dopant is chosen from the group consisting of silicon, magnesium, aluminum, gallium, and germanium.

22. The structure of claim 20, further comprising a tin-comprising solder formed and defined over said barrier layer in an area of said bonding pad.

23. The structure of claim 22, wherein said tin-comprising solder is substantially free of lead.

24. The structure of claim 20, further comprising:
   a silicon integrated circuit formed in a substrate and including said bonding pads; and
   a support substrate having a plurality of second metal regions to which different portions of said solder layer are respectively bonded.

* * * * *